United States Patent
Young

(10) Patent No.: US 8,941,393 B2
(45) Date of Patent: Jan. 27, 2015

(54) DETECTION OF A CONDUCTIVE OBJECT DURING AN INITIALIZATION PROCESS OF A TOUCH-SENSING DEVICE

(75) Inventor: Kristopher L. Young, Atlanta, GA (US)

(73) Assignee: Cypress Semiconductor Corporation, San Jose, CA (US)

( * ) Notice: Subject to any disclaimer, the term of this patent is extended or adjusted under 35 U.S.C. 154(b) by 438 days.

(21) Appl. No.: 13/218,090

(22) Filed: Aug. 25, 2011

(65) Prior Publication Data

US 2012/0212240 A1     Aug. 23, 2012

Related U.S. Application Data

(60) Provisional application No. 61/433,148, filed on Jan. 14, 2011.

(51) Int. Cl.
    *G01R 27/26*     (2006.01)
    *G06F 3/041*     (2006.01)

(52) U.S. Cl.
    CPC .......... *G01R 27/2605* (2013.01); *G06F 3/0418* (2013.01)
    USPC ........................................................ 324/679

(58) Field of Classification Search
    CPC .... G06F 3/0488; G06F 3/044; G01R 27/2605
    USPC .................... 178/18.06, 19.03; 324/658–690; 341/33; 345/173, 174
    See application file for complete search history.

(56) References Cited

U.S. PATENT DOCUMENTS

| | | | | |
|---|---|---|---|---|
| 4,305,135 | A * | 12/1981 | Dahl et al. | 341/33 |
| 6,823,728 | B1 * | 11/2004 | Barnes | 73/146 |
| 2002/0060953 | A1 * | 5/2002 | Farine et al. | 368/69 |
| 2003/0009273 | A1 * | 1/2003 | Stanley et al. | 701/45 |
| 2008/0078590 | A1 | 4/2008 | Sequine | |
| 2008/0238884 | A1 * | 10/2008 | Harish | 345/174 |
| 2009/0008161 | A1 | 1/2009 | Jones et al. | |
| 2009/0009491 | A1 | 1/2009 | Grivna | |
| 2010/0010330 | A1 | 1/2010 | Rankers et al. | |
| 2010/0214232 | A1 * | 8/2010 | Chan et al. | 345/173 |
| 2011/0073383 | A1 * | 3/2011 | Simmons | 178/18.06 |

OTHER PUBLICATIONS

International Search Report for International Application No. PCT/US11/67148 dated Apr. 10, 2012; 2 pages.
Written Opinion of the International Searching Authority for International Application No. PCT/US11/67148 dated Apr. 10, 2012; 5 pages.

* cited by examiner

*Primary Examiner* — Melissa Koval
*Assistant Examiner* — Daniel Miller
(74) *Attorney, Agent, or Firm* — Lowenstein Sandler LLC

(57) ABSTRACT

A method and system for detecting a presence of a conductive object proximate to a capacitive sense element during an initialization process of a touch-sensing device. A reference sense element is calibrated to produce a sensing parameter value. A capacitance of a plurality of capacitive sense elements is measured based on the sensing parameter value, and compared to a baseline capacitance value stored in a non-volatile memory of the touch-sensing device. The presence of a conductive object proximate to a capacitive sense element is detected when a difference between the measured capacitance and the stored baseline capacitance value is greater than a threshold value.

18 Claims, 7 Drawing Sheets

DETECTION OF A CONDUCTIVE OBJECT DURING AN INITIALIZATION PROCESS OF A TOUCH-SENSING DEVICE

RELATED APPLICATION

This application claims to the benefit of U.S. Provisional Application 61/433,148 filed Jan. 14, 2011, which is hereby incorporated by reference in its entirety.

TECHNICAL FIELD

This disclosure relates to the field of user interface devices and, in particular, to capacitive sense devices.

BACKGROUND

Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

Because capacitance also changes due to environmental conditions (e.g. changes in humidity and temperature), conventional capacitive sensing algorithms typically use a difference between an immediate value and a filtered baseline average value (initialized by a measurement taken with a non-touch state) to be able to distinguish the presence of a conductive object from an environmental change.

Some electronic devices (e.g., printers, set-top cable boxes, blue-ray players) with mechanical buttons use the state of the button as power is applied (i.e., at power up) to enter special diagnostic modes. Certain set-top cable boxes used by various cable television providers in North America require a service technician to place the set-top box into a diagnostic mode (e.g., a test mode, debug mode) by pressing one or more mechanical buttons on the device while simultaneously applying power to the device.

Although it is desirable to equip set-top boxes with capacitive sense elements as replacements for the mechanical buttons, to do so requires the device to detect the initial presence of a conductive object proximate to one or more capacitive sense elements at power up (i.e., during the initialization process of the device). However, devices using the conventional capacitive sensing algorithms based on filtered baseline averages would fail to detect the presence of a conductive object during the initialization process because the initial presence of the conductive object would prevent an accurate measurement with a non-touch state of the device (e.g., the set-top cable box described above).

BRIEF DESCRIPTION OF THE DRAWINGS

The present invention is illustrated by way of example, and not of limitation, in the figures of the accompanying drawings in which.

DETAILED DESCRIPTION

Figure 1:
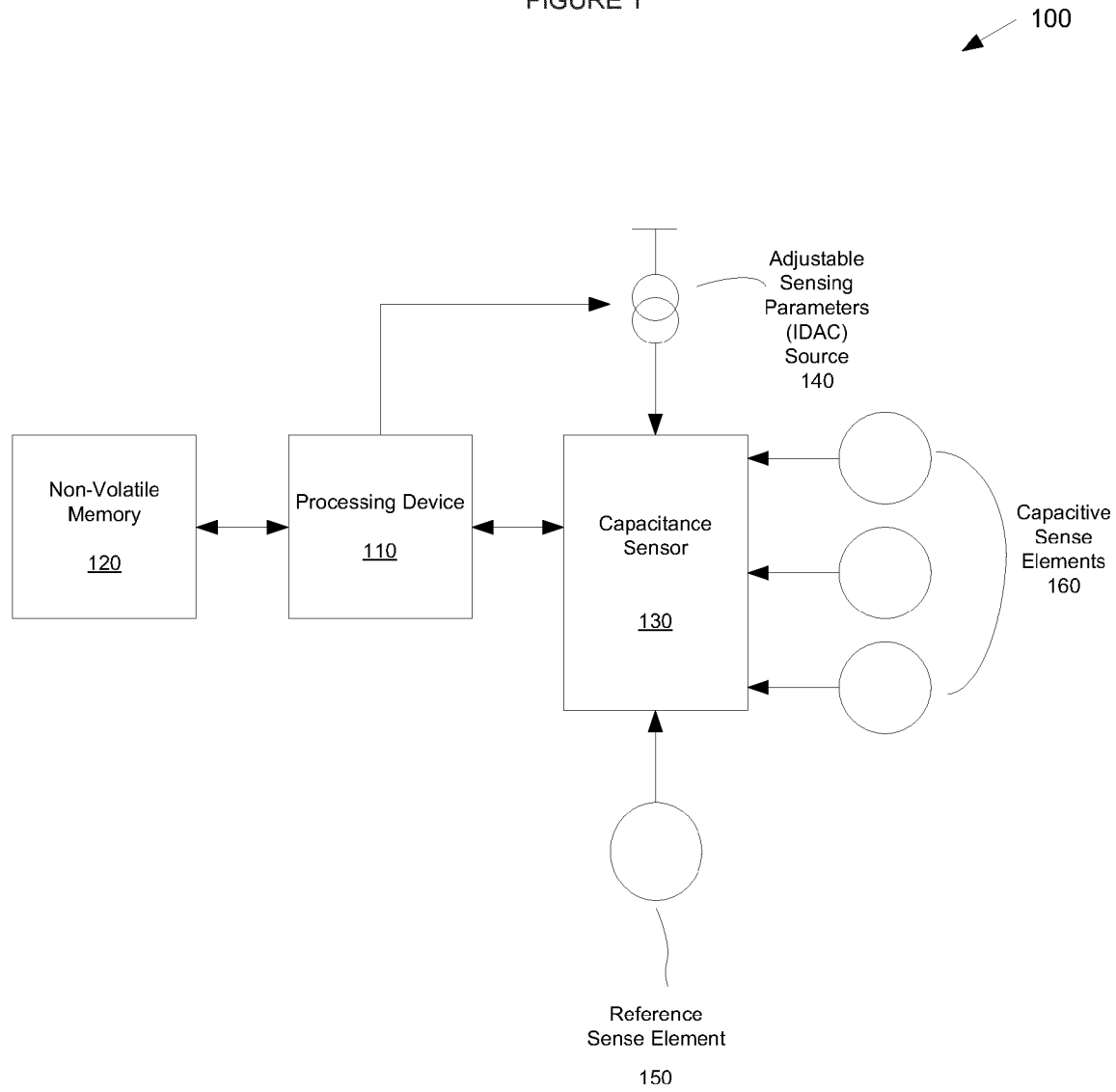
FIG. 1 is a block diagram illustrating one embodiment of an electronic system having a processing device for detecting a presence of a conductive object during an initialization process of a touch-sensing device.

A method and apparatus for detecting a presence of one or more conductive objects at power up of a touch-sensing device is described. Power up of the touch-sensing device includes the application of power to the device and any associated initialization process of the device (herein referred to as the "initialization process"). The initialization process may also occur following a reset of the touch-sensing device. In one embodiment, a reference sense element is employed to capture one or more reference sensing parameters during an initialization process of a touch-sensing device. The reference sense element is located or positioned such that a conductive object is not permitted to be present and is therefore not sensed during the initialization process of the touch-sensing device. The one or more calibrated sensing parameters are used to determine if a conductive object is proximate to any of the one or more capacitive sense elements. A measured capacitance value of each of the one or more capacitive senses elements is compared with a baseline capacitance value, which may be stored in a memory (e.g., a non-volatile memory) of the touch-sensing device, for each of the capacitive sense elements to determine a capacitance difference value. The baseline capacitance values represent the capacitance value of each capacitive sense element when not acted upon by a conductive object. The capacitance difference value for each capacitive sense element is compared to a threshold value to detect the presence of a conductive object on the touch-sensing device. The method and apparatus use a capacitance measurement of the reference sense element to determine whether any other capacitive sense elements are activated during the initialization process. In addition, a pattern of the difference values on multiple capacitive sense elements may be analyzed to determine a location of a touch event on an array of capacitive sense elements (e.g., a centroid analysis indicating a specific location of a touch event on the array of slider capacitive sense elements) as would be appreciated by one of ordinary skill in the art having the benefit of this disclosure. In an embodiment, a capacitance of each of a reference sense element and one or more capacitive sense elements is measured. A difference value is calculated by comparing the measured capacitance of the reference sense element to the measured capacitance of each of the one or more capacitive sense elements. A presence of a conductive object proximate to one or more of the capacitive sense elements is detected when the difference value is greater than a predetermined threshold value.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

FIG. 1 is a block diagram illustrating one embodiment of an electronic system 100 for detecting a presence of a conductive object proximate to a capacitive sense element during an initialization process of a touch-sensing device according to an embodiment of the present invention. Electronic system 100 includes processing device 110, non-volatile memory 120, and capacitance sensor 130 connected to reference sense element 150 and an array of capacitive sense elements 160.

Processing device 110 may reside on a common carrier substrate such as, for example, an integrated circuit ("IC") die substrate, a multi-chip module substrate, or the like. Alternatively, the components of processing device 110 may be one or more separate integrated circuits and/or discrete components. In one exemplary embodiment, processing device 110 is the Programmable System on a Chip (PSoC®) processing device, developed by Cypress Semiconductor Corporation, San Jose, Calif. Processing device 110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

Although described as non-volatile memory 120, other types of memory known by those of ordinary skill in the art may be used, such as magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Capacitance sensor 130 may be integrated into the IC of the processing device 110, or alternatively, in a separate IC. Alternatively, descriptions of capacitance sensor 130 may be generated and compiled for incorporation into other integrated circuits. For example, behavioral level code describing capacitance sensor 130, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 130.

Capacitance sensor 130 includes an adjustable sensing parameter source 140 controlled by the processing device 110. One having ordinary skill in the art will appreciate that the adjustable sensing parameter may be any known parameter that affects the output of the capacitance measurement of the reference sense element and capacitive sense elements (150 and/or 160) connected to the capacitance sensor 130, including, but not limited to a current supplied by a current digital-to-analog converter (IDAC) (as shown in the exemplary embodiments illustrated in FIGS. 1 and 2), an adjustable comparator reference voltage supplied by a voltage digital-to-analog converter (VDAC), or a variable multiplication factor of the measurement output value. The processing device 110 is configured to control the adjustable sensing parameter source to tune the output of the source, as described in detail below in connection with FIG. 3. Capacitance sensor 130 may include analog I/O for coupling to an external component, such as a touch-sense pad, a touch-sense slider, touch-sense buttons, and/or other devices. Capacitance sensor 130 and processing device 110 are described in more detail below.

In an embodiment, the capacitive sense elements 160 (collectively referred to as a "capacitive sense array") and reference sense element 150 may be responsive to the presence of a conductive object (e.g., a stylus or a user's finger) as well as the effect of one or more environmental factors. The environmental factor may be any attribute or characteristic of an environment of the capacitive sense elements 160 and reference sense element 150 that effects the capacitance of the capacitive sense elements 160 and reference sense element 150, such as, for example, temperature, humidity, moisture, etc.

In one embodiment, the capacitance sensor 130 can be used to measure capacitance using self-capacitance sensing or mutual capacitance sensing as described below. In one embodiment, the capacitance sensor 130 includes a relaxation oscillator as described below with respect to FIG. 2. In other embodiments, the capacitance sensor 130 may include other capacitance sensing circuits, such as the CapSense® Sigma-Delta (CSD) and CapSense® Successive Approximation (CSA) circuits, developed by Cypress Semiconductor, San Jose, Calif., charge accumulation circuits, charge transfer circuits, charge integration circuits, or other capacitance sensing circuits as would be appreciated by one of ordinary skill in the art having the benefit of this disclosure.

In an embodiment, the reference sense element 150 and the capacitive sense elements 160 having similar characteristics (e.g., size, similar overlay, similar sense element to ground clearance, etc.) are utilized to normalize variables that can affect capacitance and improve the ability to calibrate the sense elements.

In an embodiment, the capacitance sensor 130, which is coupled to the reference sense element 150 and capacitive sense elements 160, is configured to perform self-capacitance sensing. In a self-capacitance sensing mode, the reference sense element 150 and each capacitive sense element 160 sensor element needs only one connection wire to the capacitance sensor 130 circuit. For the self-capacitance sensing mode, the presence of a conductive object or an environmental factor acting on the reference sense element 150 or capacitive sense element 160 increases the sense element capacitance as the conductive object capacitance is added to the sense element capacitance.

In an embodiment, the capacitance sensor 130 of the reference sense element 150 and capacitive sense elements 160 is configured to perform mutual capacitance sensing. In mutual capacitance sensing mode, change in the mutual capacitance between electrodes is detected. The reference sense element 150 and each capacitive sense element 160 sensor element each use at least two electrodes: one is a transmitter (TX) electrode (also referred to herein as transmitter electrode) and the other is a receiver (RX) electrode. The intersection of the TX electrode and the RX electrode is called a sense element. When a conductive object touches a sense element or is in close proximity to the sense element, the capacitive coupling between the receiver and the transmitter of the sense element is decreased as the conductive object shunts part of the electric field to ground (e.g., chassis or earth).

Figure 2:
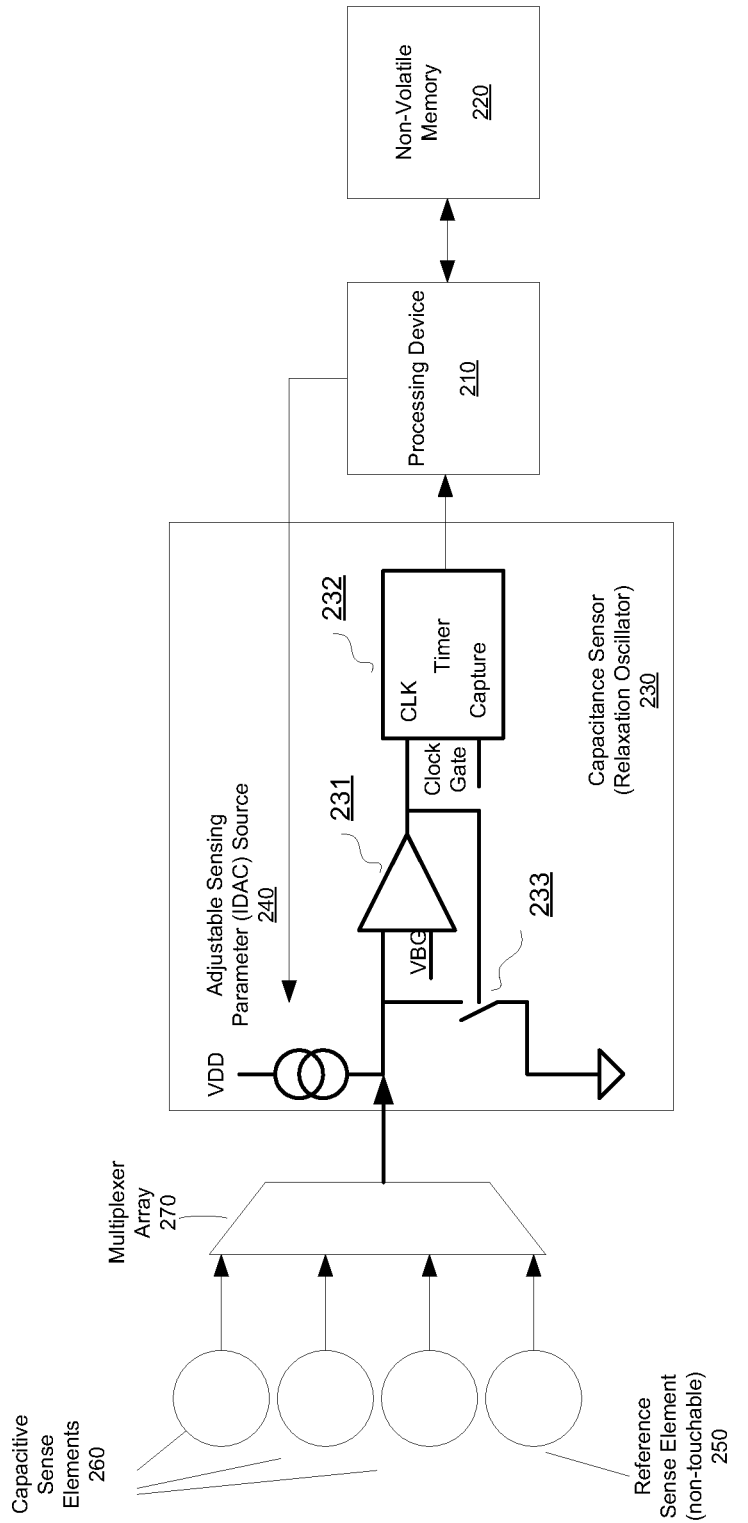
FIG. 2 is a block diagram illustrating one embodiment of an electronic system having a capacitance sensor coupled to a processing device for detecting a presence of a conductive object during an initialization process of a touch-sensing device.

FIG. 2 illustrates an embodiment of the electronic system 200 including a capacitance sensor 230 coupled to a processing device 210 for detecting a presence of a conductive object during an initialization process of a touch-sensing device. As shown, the electronic system 200 further includes a non-volatile memory 220, an array of capacitive sense elements 260, a reference sense element 250, and a multiplexer array 270. In this embodiment, the capacitance sensor 230 includes a relaxation oscillator including an adjustable IDAC current source (i.e., the sensing parameter) 240 that is programmable by the processing device 210. Although FIG. 2 illustrates the multiplexer array 270 as being external to the relaxation oscillator 230, one having ordinary skill in the art will appreciate that the multiplexer array 270 may be a part of the relaxation oscillator 230.

The relaxation oscillator 230 is formed by the capacitance to be measured from any of the capacitive sense elements 260 or reference sense element 250, the adjustable sensing parameter source 240, a comparator 231, a reset switch 233, and a timer element 232. In an embodiment, a pin (not shown) may be coupled to each of the capacitive sense elements 260 and the reference sense element 250 and the multiplexer array 270. One having ordinary skill in the art will appreciate that the operation of the relaxation oscillator 230 and components is well known in the art, and that various other arrangements and circuitry may be used in the electronic system 200 of the present invention. The relaxation oscillator is configured to charge and discharge and includes an output signal that is capable of measurement. In an embodiment, the output signal is an input into a counter that counts the number of times the charge/discharge occurs (i.e., the count measurement), where an increase in capacitance results in an increase in counts. In an alternative embodiment, instead of a counter, a digital filter may be employed at the output of the relaxation oscillator to convert the capacitance measurement into a digital value representing the capacitance.

Figure 3:
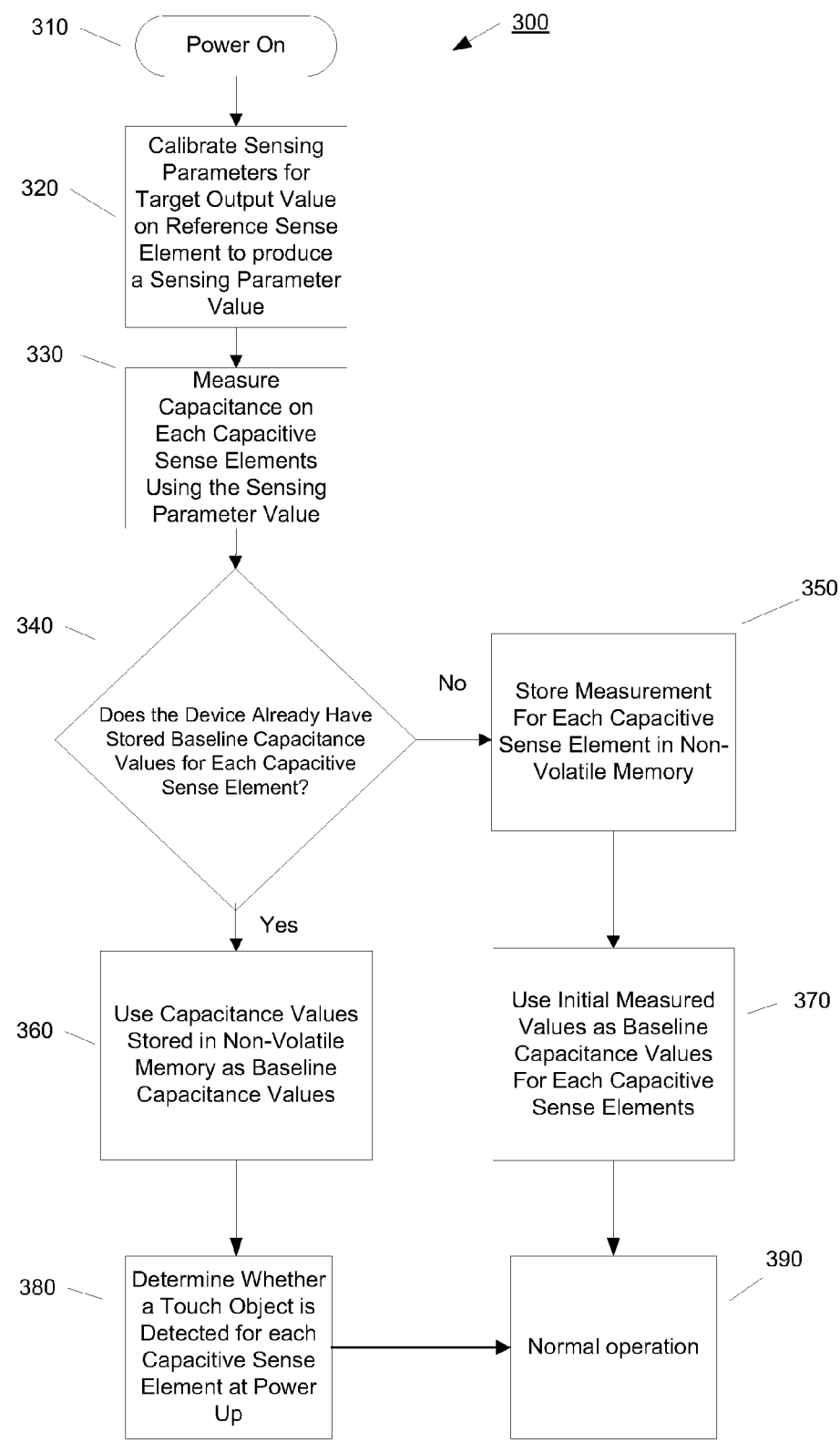
FIG. 3 illustrates one embodiment of a method of detecting a presence of a conductive object during an initialization process of a touch-sensing device.

FIG. 3 illustrates an embodiment of a method 300 of detecting a presence of a conductive object during an initialization process of a touch-sensing device. During initialization of the touch-sensing device (block 310), a capacitance measurement of a reference sense element (i.e., a sense element that is not touched or touchable during the initialization process) is set to a target output value for the reference sense element by adjusting one or more sensing parameters, at block 320. In an embodiment, the processing device (110, 210) is configured to control the adjustable sensing parameter source (140, 240) to tune the output of the source such that the capacitance measurement of the reference sense element (150, 250) is set to the target output value, where the resulting value of the sensing parameter is referred to as the sensing parameter value. The sensing parameter value is then used to measure a capacitance on each of the multiple sensing elements, at block 330 (i.e., a measurement of the capacitance of each capacitive sense element is taken at the sensing parameter value). In an embodiment, finer granularity of the sensing parameter adjustment results in an identification of a more precise reference point.

According to an embodiment of the present invention, during a manufacturing/production phase or initial testing phase of the touch-sensing device, an initial calibration takes place with no touch present and the initial measured capacitances of each of the sensing elements are stored in non-volatile memory of the device. As shown in block 340, a determination is made whether the device already has stored baseline capacitance values for each capacitive sense element. The stored baseline capacitance values represent the capacitance value of each capacitive sense element when not acted upon by a conductive object. If no baseline capacitance values have been stored, the initial measurements for each sensing element are stored in non-volatile memory, at block 350. One having ordinary skill in the art will appreciate that storage of the baseline capacitance values in block 350 typically occurs only one time during manufacturing, but may occur during post-production use of the device, for example, in the event that the stored baseline values are no longer stored in non-volatile memory due to an error or problem resulting in a loss of data.

If the device already has baseline capacitance values for each capacitive sense element stored in non-volatile memory, those capacitance values are used as baseline capacitance values, in block 360. If not, the initial measured values for each capacitive sense element are used as baseline capacitance values, at block 370. At block 380, the capacitance values for each capacitive sense element measured at the sensing parameter value are compared to the baseline capacitance value stored in non-volatile memory to determine a difference (referred to as the "capacitance difference"). Following block 380 (or block 370), normal operation proceeds (i.e., taking a capacitance measurement and updating the baseline average, in block 390).

Next, the capacitance difference for each capacitive sense element is compared to a threshold value. The presence of a conductive object proximate to a capacitive sense element is detected (i.e., sense element activation) if the capacitance difference is above the threshold value for that capacitive sense element. If the capacitance difference is less than or equal to the threshold value for a capacitive sense element, then no conductive object is detected for that capacitive sense element. As illustrated, method 300 enables the calibration of the sensing parameter to fine tune an output of the reference sense element so that it matches a target measurement output value during each initialization, which results in the calibration of the sensing parameter that are stable over environmental conditions.

One having ordinary skill in the art will appreciate that following the initialization process, the baseline values may be tracked according to an any known method, including, but not limited to, a baseline averaging approach or drift compensation using a slew-rate limited reference adjustment.

Figure 4:
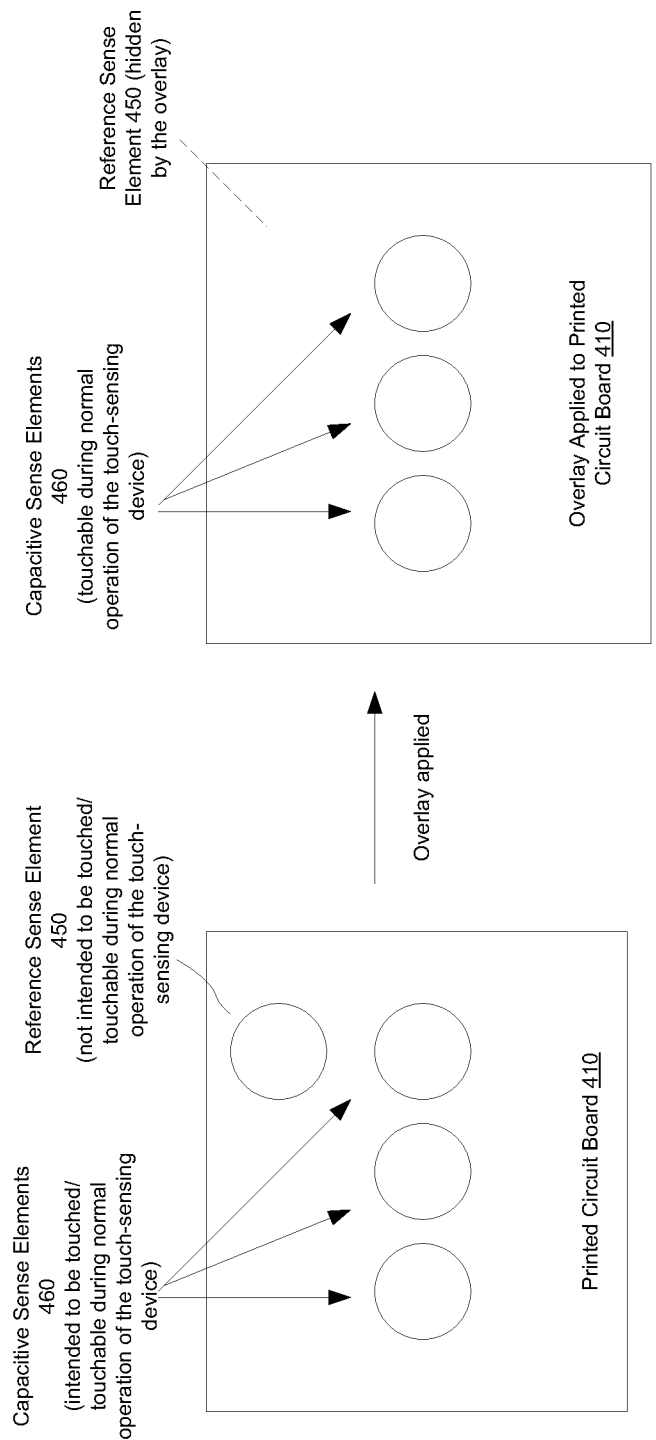
FIG. 4 illustrates a top-side view of an embodiment of a printed circuit board including an array of capacitive sense elements and a reference capacitive sense element, with and without an overlay.

FIG. 4 illustrates an embodiment of the present invention showing an exemplary approach to "hiding" or otherwise rendering the reference sense element 150 not responsive to a presence of a conductive object during an initialization process of the touch-sensing device. As shown, a printed circuit board 410 having disposed thereon a reference sense element 150 and an array of capacitive sense elements 160 disposed thereon. During manufacturing, an overlay is applied to the printed circuit board 410 such that the reference sense element 450 is not responsive to the presence of a conductive object in close proximity or contact with the overlay. In this arrangement, the capacitive sense elements 460 are responsive to the presence of a conductive object in close proximity or contact with the overlay.

Figure 5:
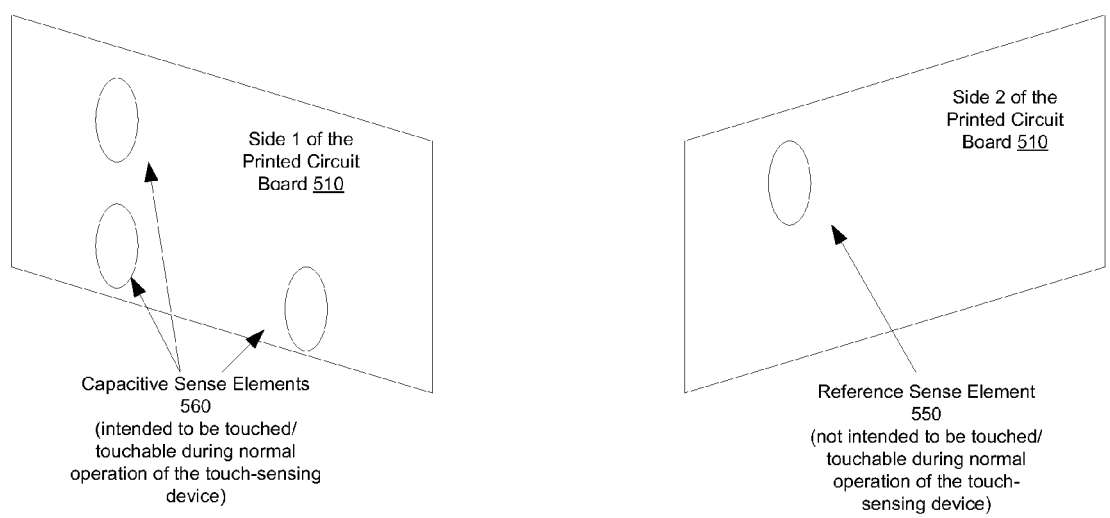
FIG. 5 illustrates another embodiment of a printed circuit board including an array of capacitive sense elements arranged on a first side the printed circuit board and a reference capacitive sense element arranged on a second side of the printed circuit board.

Alternatively, a two-sided printed circuit board 510 may be utilized, as shown in FIG. 5. The printed circuit board 510 includes a first side (Side 1) that is externally facing when arranged within the touch-sensing device, and a second side (Side 2) that is not accessible by a user during normal operation of the touch-sensing device. As shown, the capacitive sense elements 560 that are intended to be touched/touchable during normal operation of the touch-sensing device are disposed on Side 1 of the printed circuit board 510, while the reference sense element 550 is "hidden" from the user on Side 2 of the printed circuit board 510. One having ordinary skill in the art will appreciate that in addition to the embodiments illustrated in FIGS. 4 and 5, there are other arrangements and/or techniques that may be utilized in order to hide the reference sense element such that it is not touched/touchable during normal operation of the touch-sensing device.

Figure 6:
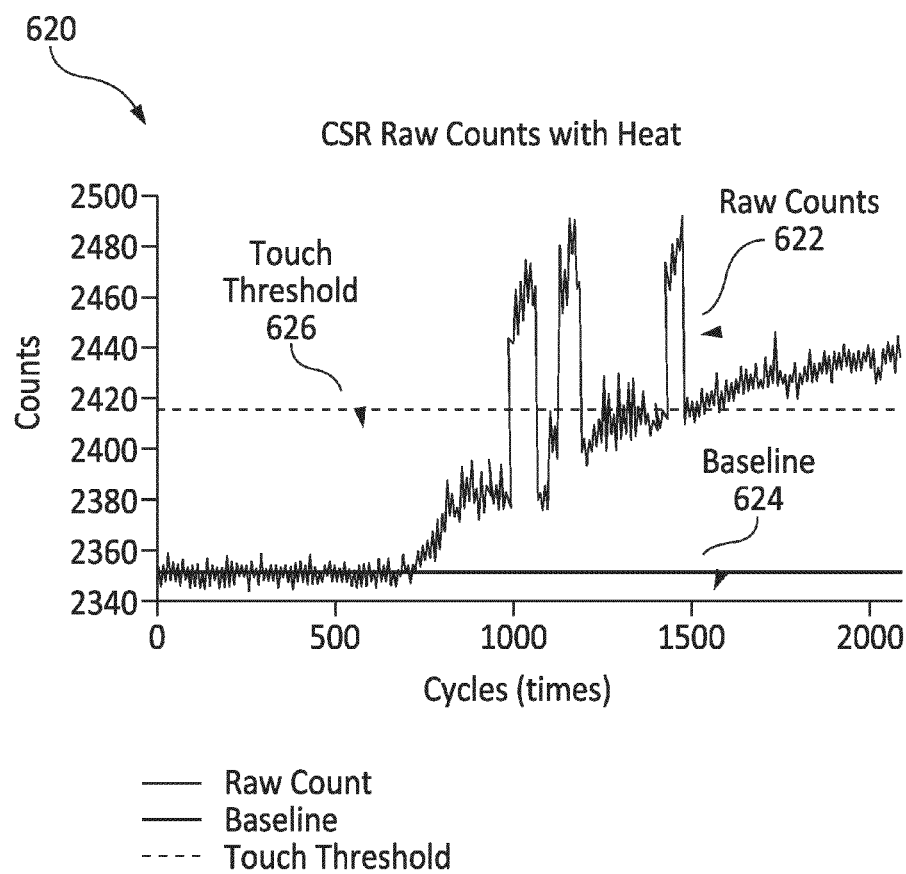
FIG. 6 illustrates a graph of effects of rising temperature and detection of a conductive object on capacitance of a capacitive sense element measured by a capacitive switched relaxation oscillator with software-only temperature compensation.

Referring to graph 620 of FIG. 6, under software-only compensation, a reference, or baseline 624, is tracked so the computing device knows when the user interaction is present (e.g., conductive object on or proximate to a button) by comparing the capacitive sensor relaxation oscillators (CSR) raw counts 622 (representing the capacitance due to the presence of a conductive object, such as a user's finger) with the baseline 624. If the CSR raw counts 622 exceed the baseline 624 by a threshold value, user interaction is deemed to be present and appropriate actions are taken; otherwise, no action is taken. The baseline 624 is usually established immediately after power-on. If a user presses a button at the moment the touch-sensing device is powered on and being initialized, the software will establish a baseline which includes the capacitance of a finger. Note that the magnitude of raw count change due to temperature in FIG. 6 can be equal to or greater than the magnitude of raw count change due to the presence of a finger.

Figure 7:
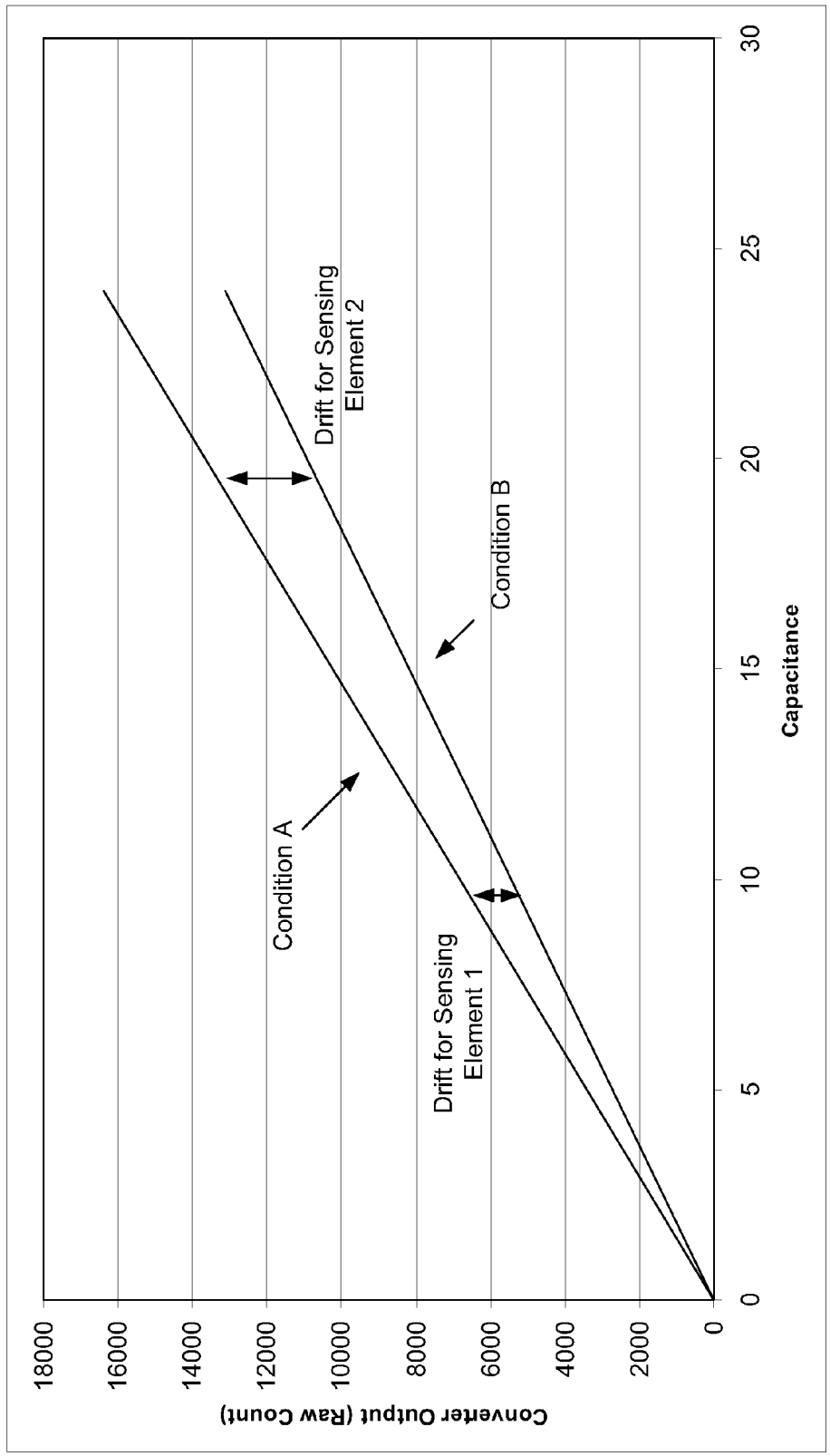
FIG. 7 illustrates a graph showing an exemplary comparison of effects of different environmental conditions on capacitance of a capacitive sense element measured at one environmental condition (Condition A) and at another environmental condition (Condition B) according to one embodiment.

FIG. 7 illustrates a graph showing an exemplary comparison of effects of an environmental condition (e.g., rising temperature) on capacitance measured without an adjustment of a sensing parameter under one environmental condition (Condition A) and then measured under another environmental condition (Condition B), according to embodiments of the present invention. It also shows the raw count drift between the two environmental conditions on sensing elements with two different capacitances (sense element 1 and sense element 2). As shown, environmental changes generally do not cause an offset error in capacitive measurements, but instead generally introduce a gain error. This causes the raw count drift due to the change in environmental conditions to be different for sensors with different capacitances. Thus a capacitive sensor performing a measurement of a sensing element that is unresponsive to touch and without calibration of sensing parameters could detect the change in environmental condition exemplified in FIG. 6 by observing the drift in raw counts on the no-touch sensing element, however, the magnitude of the raw count drift on other sensing elements due to environmental conditions cannot be determined accurately by this method. Also note that the slope of the measurement output versus capacitance transfer function determines the number of differential output counts resulting from the small change in capacitance due to a finger touch. Therefore, without adjusting the sensing parameter, the touch "signal" resulting from the same touch will have different magnitudes at different environmental conditions. By changing the sensing parameter, according to embodiments of the present invention, the measurement gain can be adjusted to obtain the same output versus capacitance transfer function over different environmental conditions. This is necessary for power up button press detection since the environmental condition on power up and during the initialization process will be unknown.

The embodiments described herein are not limited to any particular touch-sensing device, but can be used in other capacitive sense implementations, for example, the sense device may be a touch screen, a touch-sense pad for notebook implementations, a touch-sense slider, or touch-sense buttons (e.g., capacitance sense buttons). In one embodiment, these sense devices may include one or more capacitive sense elements. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sense implementations may be used in conjunction with non-capacitive sense elements, including but not limited to pick buttons, sliders (e.g., display brightness and contrast), scroll-wheels, multi-media control (e.g., volume, track advance, etc) handwriting recognition and numeric keypad operation.

Certain portions of the embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

The particular features, structures or characteristics described herein may be combined as suitable in one or more embodiments of the invention. In addition, while the invention has been described in terms of several embodiments, those skilled in the art will recognize that the invention is not limited to the embodiments described. The embodiments of the invention can be practiced with modification and alteration within the scope of the appended claims. The specification and the drawings are thus to be regarded as illustrative instead of limiting on the invention.

What is claimed is:

1. A method, comprising:
   during an initialization process of a touch-sensing device:
      measuring a capacitance of a reference sense element disposed on a second side of a printed circuit board of the touch-sensing device, wherein the measured capacitance is responsive to an environmental condition and is not responsive to a conductive object,
      comparing the measured capacitance of the reference sense element to a target measurement output value, and
      calibrating a capacitance measurement of the reference sense element to produce a sensing parameter value;
   comparing a capacitance measured on each of a plurality of capacitive sense elements disposed on a first side of the printed circuit board based on the sensing parameter value to a baseline capacitance value for each of the plurality of capacitive sense elements to determine a capacitance difference value; and
   detecting a presence of the conductive object proximate to a capacitive sense element when the capacitance difference value for the capacitive sense element is greater than a threshold value.

2. The method of claim 1, wherein calibrating the capacitance measurement of the reference sense element further comprises adjusting a sensing parameter to the sensing parameter value to set the measured capacitance of the reference sense element to the target measurement output value.

3. The method of claim 2, wherein the sensing parameter is a current of a current source connected to a capacitance sensor of the touch-sensing device.

4. The method of claim 2, wherein the sensing parameter is a voltage of a voltage source connected to a capacitance sensor of the touch-sensing device.

5. The method of claim 2, wherein the sensing parameter is programmable by a processing device.

6. The method of claim 1, wherein the presence of the conductive object proximate to the capacitive sense element is detected during the initialization process of the touch-sensing device.

7. The method of claim 1, wherein the baseline capacitance value for each of the plurality of capacitive sense elements is stored in a non-volatile memory.

8. A system, comprising:
   a processing device coupled to a capacitance sensor, the capacitance sensor comprising:
      a printed circuit board comprising a first side including a plurality of capacitive sense elements disposed thereon, and a second side including a reference sense element disposed thereon, and
      a sensing parameter,
   wherein the processing device is to:
      measure a capacitance of the reference sense element, wherein the measured capacitance is responsive to an environmental condition and is not responsive to a presence of a conductive object,
      compare the measured capacitance of the reference sense element to a target measurement output value,
      adjust the sensing parameter to a sensing parameter value to set a measured capacitance of the reference sense element to the target measurement output value,
      compare a capacitance of each of the plurality of capacitive sense elements to a baseline capacitance value for each of the plurality of capacitive sense elements to determine a capacitance difference value, and
      detect a presence of the conductive object proximate to a capacitive sense element when the capacitance difference value for the capacitive sense element is greater than a threshold value.

9. The system of claim 8, wherein the capacitance sensor is to measure the capacitance of each of the plurality of capacitive sense elements based on the sensing parameter value.

10. The system of claim 8, wherein the baseline capacitance value for each of the plurality of capacitive sense elements is stored in a non-volatile memory of the touch-sensing device.

11. The system of claim 8, wherein the presence of the conductive object proximate to the capacitive sense element is detected during an initialization process of the touch-sensing device.

12. The system of claim 8, wherein the reference sense element is not responsive to the presence of the conductive object during an initialization process of the touch-sensing device.

13. The system of claim 8, wherein the sensing parameter is a programmable current.

14. The system of claim 8, further comprising a printed circuit board comprising an overlay covering the reference sense element such that the reference sense element is not responsive to a presence of a conductive object proximate to the reference sense element during an initialization process of the touch-sensing device.

15. A non-transitory computer-readable medium including data that, when accessed by a processing device, causes the processing device to perform operations comprising:
   during an initialization process power up of a touch-sensing device, measuring a capacitance of a reference sense element disposed on a second side of a printed circuit board of the touch-sensing device, wherein the measured capacitance is responsive to an environmental condition and is not responsive to a presence of a conductive object, comparing the measured capacitance of the reference sense element to a target measurement output value, and calibrating a measurement of a reference sense element to produce a sensing parameter value;
   comparing a capacitance measured on each of a plurality of capacitive sense elements disposed on a first side of the printed circuit board based on the sensing parameter value to a baseline capacitance value stored in a non-volatile memory for each of the plurality of capacitive sense elements to determine a capacitance difference value; and
   detecting a presence of the conductive object proximate to a capacitive sense element during the initialization process power up of the touch-sensing device when the capacitance difference value for the capacitive sense element is greater than a touch threshold value.

16. The non-transitory computer-readable medium of claim 15, wherein the operations further comprise adjusting a sensing parameter to a sensing parameter value to set a capacitance of the reference sense element to a target measurement output value.

17. The non-transitory computer-readable medium of claim 16, wherein the sensing parameter is a current of a current source connected to a capacitance sensor of the touch-sensing device.

18. The non-transitory computer-readable medium of claim 15, wherein the capacitance on the capacitive sense element is measured by a capacitance sensor.

* * * * *